United States Patent [19]

Hasegawa

[11] Patent Number: 5,022,035
[45] Date of Patent: Jun. 4, 1991

[54] SEMICONDUCTOR LASER DEVICE
[75] Inventor: Kazuyoshi Hasegawa, Itami, Japan
[73] Assignee: Mitsubishi Denki Kabushiki Kaisha, Japan
[21] Appl. No.: 479,614
[22] Filed: Feb. 13, 1990
[30] Foreign Application Priority Data
  Mar. 28, 1989 [JP] Japan .................... 1-77722
[51] Int. Cl.⁵ ............................. H01S 3/045
[52] U.S. Cl. ...................... 372/36; 357/75; 357/81
[58] Field of Search ............ 372/36, 23; 357/75, 357/81

[56] References Cited
U.S. PATENT DOCUMENTS
4,901,325 2/1990 Kato et al. .................... 372/23

FOREIGN PATENT DOCUMENTS
60-175476 9/1985 Japan .
61-159788 7/1986 Japan .

Primary Examiner—James W. Davie
Attorney, Agent, or Firm—Leydig, Voit & Mayer

[57] ABSTRACT

A semiconductor laser device includes a heat sink having a plurality of element mounting portions, each having an element mounting surface and an insulator separating the element mounting portions from each other. A semiconductor laser element is arranged on each element mounting surface and a corresponding light receiving element for each laser element is disposed for monitoring the emitted laser light. External control circuits for adjusting the laser outputs of the respective laser elements are located outside the laser device package.

3 Claims, 3 Drawing Sheets

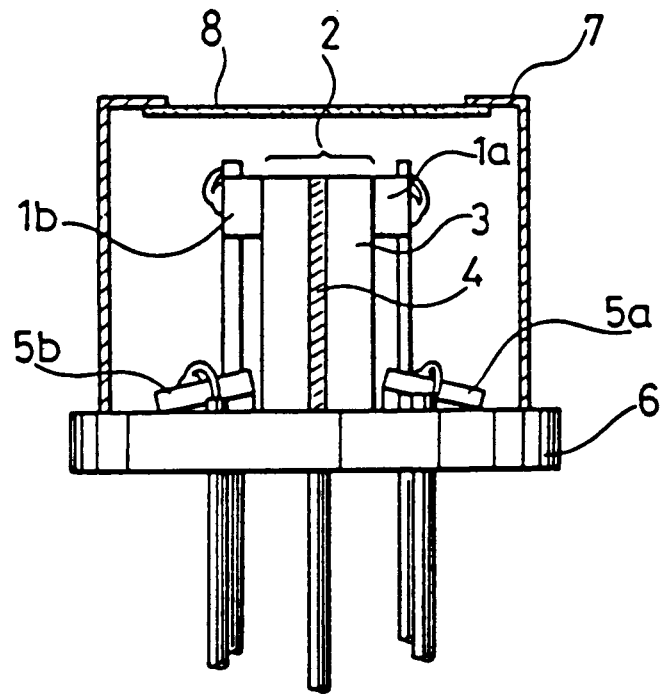
FIG. 1.a
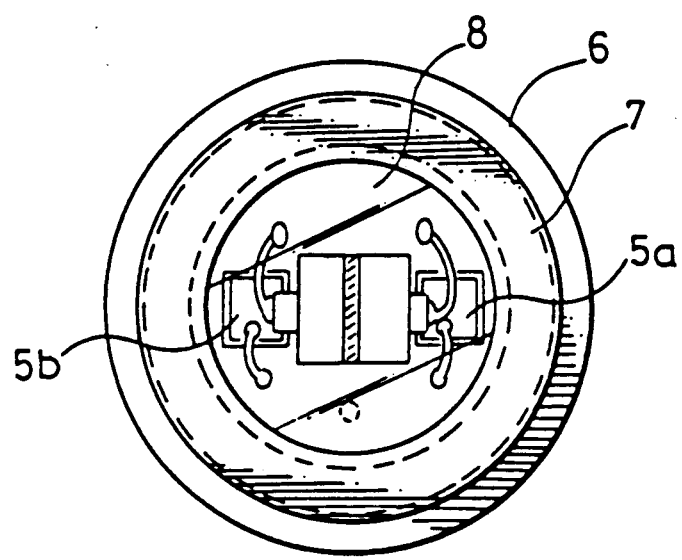
FIG. 1.b

SEMICONDUCTOR LASER DEVICE

FIELD OF THE INVENTION

The present invention relates to a semiconductor laser device which is used as a light source for example, in an optical disk apparatus.

BACKGROUND OF THE INVENTION

FIG. 2 shows a cross-section of a prior art two beam array semiconductor laser (hereinafter referred to as "two beam array LD") device. In FIG. 2, reference numeral 10 designates a monolithic two beam array LD chip. This two beam array LD chip 10 is bonded onto a silicon submount 11 which is mounted on a heat sink 12. Reference numeral 5 designates a photodiode (hereinafter referred to as "monitor PD") for monitoring light emitted by the two beam array LD chip 10. The heat sink 12 and the monitor photodiode 5 are bonded onto a stem 6. Reference numeral 7 designates a cap, and reference numeral 8 designates a window fixed to the cap 7.

This laser device will operate as follows.

The rear surface, i.e., monitor light emitted from the two beam array LD chip 10 is detected by the monitor photodiode 5 which is disposed on the stem 6. Those light signals are converted into an electric signal by the monitor photodiode 5, and the electric signal is sent to an APC (Auto Power Control) circuit located outside the laser device. The light outputs of the laser emitted from the front facet of the two beam array LD chip 10 are adjusted in response.

In the semiconductor laser device of such a construction, the two monitor lights emitted from the beam array LD chip 10 is received by the monitor photodiode 5. Therefore, when the two laser lights are operated at the same time, they cannot be controlled independently by the APC. Furthermore, they are apt to receive thermal and electrical interference.

FIG. 3 shows a semiconductor laser device disclosed in Japanese Published Patent Application 60-175476. In FIG. 3, reference numeral 14 designates a semiconductor substrate. Reference numeral 13 designates an electrode disposed on the semiconductor substrate 14. Reference numeral 15 designates an insulating region produced at a bottom portion of the substrate 14. The semiconductor substrate 14 is disposed on a heat sink 16. A plurality of heat sinks 16 for a plurality of respective semiconductor substrates 14 are insulated by insulator 17 from each other. That is, metal heat sink 16 and insulator 17 for electrode separation are arranged in a sandwich manner, and semiconductor chips are mounted on the respective heat sinks. In the semiconductor laser device of such a construction, it is possible to electrically and thermally separate the semiconductor chips from each other.

FIG. 4 shows a semiconductor laser array device disclosed in Japanese Published Patent Application 61-159788. In FIG. 4, reference numeral 18 designates a semiconductor laser array. Reference numeral 19 designates an n type GaAs heat sink. Reference numeral 20 designates a pn junction photodiode disposed on the heat sink 19. Reference numeral 21 designates an electrode. Reference numeral 22 designates a remainder left from etching required portions of the heat sink 19. The semiconductor laser array 18 includes a plurality of semiconductor laser elements disposed on the heat sink 19, and the pn junction photodiodes 20 are disposed just behind the respective semiconductor laser elements in array 18 on the heat sink 19. The remainder 22 is disposed between the respective photodiodes. In such a construction, laser light emitted from the rear facets of respective semiconductor laser elements are precisely monitored by the photodiodes 20. Furthermore, since GaAs region 22 of convex configuration lies between adjacent photodiodes, the respective laser beams can be independently monitored without thermal and electrical interferences.

In the semiconductor laser device disclosed in 60-175476, however, when an LD chip is used as a semiconductor chip, a plurality of LD chips are arranged on the same main surface. Therefore, when the respective laser beams are emitted at the same time and are monitored by a light receiving element (not shown), there arise problems of thermal and electrical interference. Furthermore, it is impossible to drive the respective laser lights independently with an APC.

In the semiconductor laser array device disclosed in 61-159788, since the respective laser elements are placed on the same surface, a plurality of pn junction photodiodes which monitor the light outputs have to be disposed quite close to the laser array even when a GaAs convex region 22 is disposed between the adjacent photodiodes. This results in difficulty in production. Furthermore, since the heat sink comprises GaAs, the heat radiation capacity of the heat sink is poor.

SUMMARY OF THE INVENTION

It is an object of the present invention to provide a semiconductor laser device for independent control by an APC of the respective laser beams, and having reduced thermal and electrical interference.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a semiconductor laser device includes a heat sink with a plurality of element mounting portions each having an element mounting surface and insulators for electrically separating the respective element mounting portions from each other. A semiconductor laser element and light receiving element are disposed on an element mounting surface while another laser element and light receiving element are disposed on another element mounting surface. Accordingly, the respective laser elements are not subjected to thermal and electrical interference, and the respective laser beams can be individually and precisely monitored. Furthermore, since a light receiving element is provided for each laser element, the lasers can be independently driven by an APC.

BRIEF DESCRIPTION OF THE DRAWINGS

FIGS. 1(a) and (b) are a cross-sectional view and a plan view respectively showing a two beam array semiconductor laser device according to a first embodiment of the present invention;

DETAILED DESCRIPTION OF THE PREFERRED EMBODIMENTS

Figure 2:
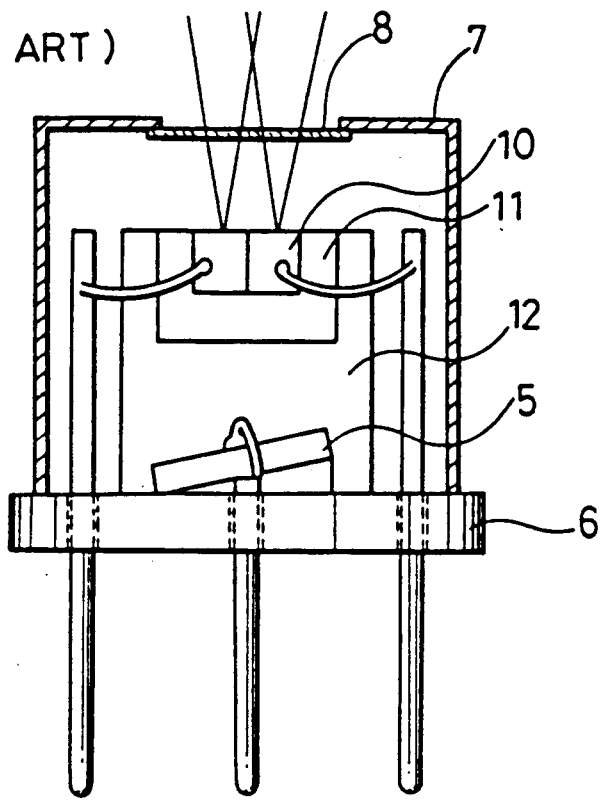
FIG. 2 is a cross-sectional view showing a prior art two beam semiconductor laser device.
Figure 3:
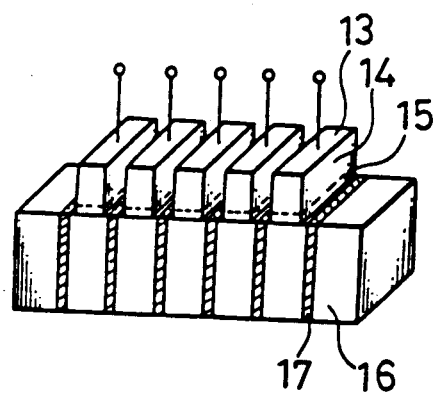
FIG. 3 is a perspective view showing a prior art semiconductor laser device.
Figure 4:
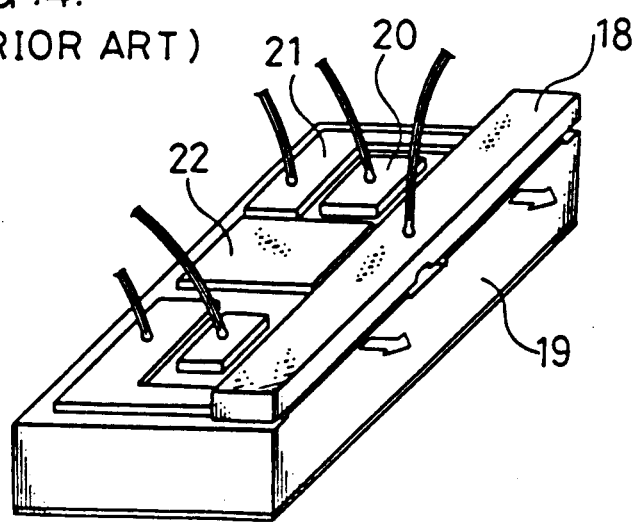
FIG. 4 is a perspective view showing a prior art semiconductor laser array device.

An embodiment of the present invention will be described in detail with reference to the drawings.

FIG. 1(a) shows a cross-sectional view of a two beam array semiconductor laser device according to a first embodiment of the present invention and FIG. 1(b) shows a plan view thereof. In FIG. 1, reference numeral 2 designates a laminated layer heat sink including an insulator 4 comprising alumina having relatively poor thermal conductivity and two element mounting portions 3 comprising silver having relatively good thermal conductivity arranged on opposing sides of the insulator 4. Reference numerals 1a and 1b designate semiconductor laser chips (hereinafter referred to as "laser diode") disposed on the element mounting surfaces of the respective element mounting portions 3. Monitor light receiving elements (hereinafter referred to as "photodiode") 5a and 5b are disposed beyond the semiconductor laser chips 1a and 1b. Reference numeral 6 designates a stem for mounting the heat sink 2 and the photodiodes 5a and 5b. This stem 6 has five lead terminals. Reference numeral 7 designates a cap. Reference numeral 8 designates a window fixed to the cap 7. APC circuits corresponding to the respective laser diodes 1a and 1b are located outside the device.

This laser device will operate as follows.

The monitor light emitted from the laser diodes 1a and 1b are respectively received by the photodiodes 5a and 5b at positions beyond the laser diodes, respectively, thereby generating currents. The currents are to the respective APC circuits. Herein, the amplitudes of the current and the light emitted from the front facet of the laser diodes are proportional, and the currents generated by the photodiodes 5a and 5b are respectively controlled to be constant by the respective APC circuits. Thus, the light outputs from the front facets of the laser diodes 1a and 1b are held at constant values.

When the laser diodes 1a and 1b generate light, heat is generated in the neighborhood of the light generation point at the same time. The heat is transmitted to the stem 6 from the element mounting portions 3 of laminated heat sink 2. Since the insulator 4 having relatively poor thermal conductivity is inserted between the element mounting portions 3, the laser diodes 1a and 1b are not subject to thermal and electrical interference, and the respective laser can be accurately monitored independently.

While in the above-illustrated embodiment the laser diodes 1a and 1b are directly mounted on the heat sink 3, a Si submount for relieving thermal stress may be provided therebetween.

While in the above-illustrated embodiment the element mounting portion 3 comprises silver and the insulator 4 comprises alumina, the element mounting portion may comprise copper or iron and the insulator may comprise quartz.

In the above-illustrated embodiment a two beam array laser diode is described, but the present invention is not restricted to a two beam array laser diode.

Figure 5:
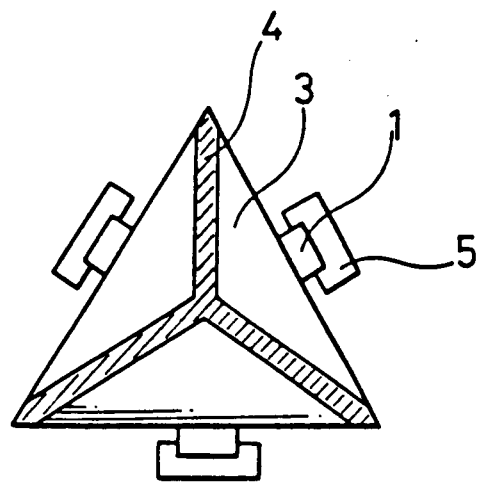
FIG. 5 is a diagram schematically showing the construction of a three beam array LD according to a second embodiment of the present invention.
Figure 6:
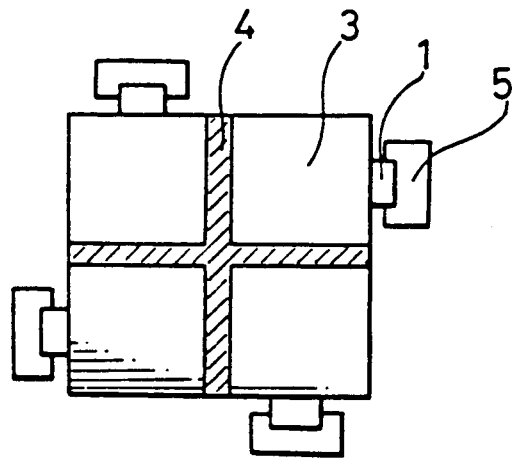
FIG. 6 is a diagram showing a brief construction of a four beam array LD according to a third embodiment of the present invention.

FIG. 5 shows a three beam array laser diode according to a second embodiment of the present invention, and FIG. 6 shows a four beam array laser diode according to a third embodiment of the present invention. In these embodiments, paired laser diodes 1 and photodiodes 5 are mounted on individual element mounting surface of the element mounting portion 3, and the respective element mounting portions 3 are thermally and electrically separated by the insulator 4.

As is evident from the foregoing description, according to the present invention, a heat sink includes a plurality of element mounting portions each having an element mounting surface and an insulator separating the element mounting portions from each other, and a semiconductor laser element is disposed on each element mounting surface of an element mounting portion. Therefore, the laser diodes are not subjected to thermal and electrical interference and the respective laser can be independently and accurately monitored. Furthermore, a plurality of laser diodes are independently driven by an APC, thereby enabling simultaneous stable light generation.

What is claimed is:

1. A semiconductor laser device comprising:
    a laminated heat sink comprising at least two electrically conductive element mounting portions, each element mounting portion having an element mounting surface, and an electrical and thermal insulator electrically and thermally isolating the element mounting portions from each other, said element mounting portions being laminated with said electrical and thermal insulator therebetween;
    a semiconductor laser element mounted to each of the element mounting surfaces; and
    a light receiving element corresponding to each laser element for monitoring light emitted by the respective laser element disposed proximate the element mounting surface on which the corresponding laser element is mounted.

2. A semiconductor laser device as defined in claim 1 wherein said element mounting portions of said heat sink are selected from the group consisting of silver, copper, and iron, and said insulator is selected from the group consisting of alumina and quartz.

3. A semiconductor laser device as defined in claim 1 including a stem including a base and a plurality of mutually electrically isolated terminals passing through the base wherein the heat sink and light receiving elements are mounted on the base and the laser element and light receiving elements are electrically connected to respective terminals.

* * * * *